(12) United States Patent
Ma et al.

(10) Patent No.: US 12,513,866 B2
(45) Date of Patent: Dec. 30, 2025

(54) AIR-ASSISTED IMMERSION COOLING SYSTEMS

(71) Applicant: Dell Products L.P., Round Rock, TX (US)

(72) Inventors: Xin Zhi Ma, Shanghai (CN); Wan Hui Yang, Shanghai (CN)

(73) Assignee: Dell Products L.P., Round Rock, TX (US)

( * ) Notice: Subject to any disclaimer, the term of this patent is extended or adjusted under 35 U.S.C. 154(b) by 231 days.

(21) Appl. No.: 18/483,648

(22) Filed: Oct. 10, 2023

(65) Prior Publication Data

US 2025/0098124 A1   Mar. 20, 2025

(30) Foreign Application Priority Data

Sep. 18, 2023   (CN) .......................... 202311205628.0

(51) Int. Cl.
*H05K 7/20* (2006.01)

(52) U.S. Cl.
CPC ..... *H05K 7/20836* (2013.01); *H05K 7/20236* (2013.01); *H05K 7/20272* (2013.01); *H05K 7/20781* (2013.01)

(58) Field of Classification Search
CPC ........... H05K 7/20236; H05K 7/20272; H05K 7/20781; H05K 7/20836
See application file for complete search history.

(56) References Cited

U.S. PATENT DOCUMENTS 10,932,390 B2 *   2/2021   Korikawa .......... H05K 7/20818
2019/0357385 A1 *  11/2019   Miyazaki ........... H05K 7/20236

FOREIGN PATENT DOCUMENTS

EP              4068931 A1 * 10/2022  ......... H05K 7/20781

* cited by examiner

*Primary Examiner* — Robert J Hoffberg
(74) *Attorney, Agent, or Firm* — McDermott Will & Schulte LLP

(57) ABSTRACT

In one or more embodiments, a liquid cooling system may include one or more air-assist modules (AAMs) for reducing the amount of liquid coolant needed to cool information handling systems immersed in the coolant. A controller communicatively coupled to a coolant pump, an inflation pump, a deflation valve and a coolant level sensor may determine when to add liquid coolant as well as when to increase or decrease the amount of air in the one or more air-assist modules based on the level of liquid coolant and a temperature of the coolant.

18 Claims, 6 Drawing Sheets

AIR-ASSISTED IMMERSION COOLING SYSTEMS

BACKGROUND

Field of the Disclosure

This disclosure relates generally to liquid cooling systems for immersion cooling of for information handling systems and more particularly to improving cooling in tanks with liquid cooling systems.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

SUMMARY

Embodiments may be generally directed to an air-assist cooling system for a liquid cooling system comprising a tank, a plurality of rails for mounting a plurality of information handling systems, a coolant pump for introducing a liquid coolant to immerse the plurality of information handling systems in the coolant and a coolant level sensor. The air-assist cooling system may comprise one or more air-assist modules (AAM) s mounted on a set of the plurality of rails; an inflation pump for introducing air into an AAM of the one or more AAMs; and a controller executing instructions to: communicate with the coolant level sensor to monitor a level of the coolant in the tank; and communicate with one or more of the coolant pump and the inflation pump to adjust an amount of the coolant in the tank.

In some embodiments, the gas comprises air. In some embodiments, the air-assist cooling system further comprising a conduit coupling the inflation pump to one or more air inlet valves, wherein the controller executes instructions to selectively open an air inlet valve of the one or more air inlet valves to inflate the AAM. In some embodiments, one or more of the inflation pump and the deflation valve are integral with the AAM. In some embodiments, the controller executes instructions to adjust a ratio between the coolant and the air in the tank. In some embodiments, the controller executes instructions to adjust a flow of the coolant in the tank. In some embodiments, the controller executes instructions to adjust a heat exchange efficiency of the coolant in the tank. In some embodiments, the controller executes instructions to adjust a heat dissipation effect of the coolant in the tank.

Embodiments may be generally directed to a cooling system for cooling a plurality of information handling systems. The cooling system may comprise a tank; a plurality of rails for mounting a plurality of information handling systems; a coolant pump for introducing a liquid coolant to immerse the plurality of information handling systems in the coolant; a coolant level sensor for detecting a level of the coolant in the tank; one or more air-assist modules (AAM) s mounted on a set of the plurality of rails; an inflation pump for introducing air into an AAM of the one or more AAMs; and a controller executing instructions to: communicate with the coolant level sensor to monitor a level of the coolant in the tank; and communicate with one or more of the coolant pump and the inflation pump to adjust an amount of the coolant in the tank.

In some embodiments, the gas comprises air. In some embodiments, the cooling system further comprises a conduit coupling the inflation pump to one or more air inlet valves, wherein the controller executes instructions to selectively open an air inlet valve of the one or more air inlet valves to inflate the AAM. In some embodiments, one or more of the inflation pump and the deflation valve are integral with the AAM. In some embodiments, the controller executes instructions to adjust a ratio between the coolant and the air in the tank. In some embodiments, the controller executes instructions to adjust a flow of the coolant in the tank. In some embodiments, the controller executes instructions to adjust a heat exchange efficiency of the coolant in the tank. In some embodiments, the controller executes instructions to adjust a heat dissipation effect of the coolant in the tank.

Embodiments may be generally directed to a method of cooling information handling systems. The method may comprise coupling an information handling system to a server rail of a plurality of server rails in a tank; coupling one or more air-assist modules (AAMs) to one or more rails of the plurality of rails; operating a coolant pump to introduce a liquid coolant into the tank; determining a level of the coolant in the tank; positioning an inflation pump relative to the one or more AAMs; determining, by a controller communicatively coupled to a coolant level sensor, a level of the coolant in the tank; and performing one or more of operating the coolant pump to pump the coolant into the tank, operating the inflation pump to displace at least a portion of the coolant from the AAM, and operating a deflation valve to remove at least a portion of the air from the AAM.

In some embodiments, performing one or more of operating the coolant pump to pump the coolant into the tank, operating the inflation pump to displace at least a portion of the coolant from the AAM, and operating a deflation valve to remove at least a portion of the air from the AAM comprises adjusting a ratio between the coolant and the air in the tank. In some embodiments, performing one or more of operating the coolant pump to pump the coolant into the tank, operating the inflation pump to displace at least a portion of the coolant from the AAM, and operating a deflation valve to remove at least a portion of the air from the AAM comprises adjusting a heat exchange efficiency of the coolant in the tank. In some embodiments, performing one or more of operating the coolant pump to pump the coolant into the tank, operating the inflation pump to displace at least a portion of the coolant from the AAM, and operating a deflation valve to remove at least a portion of the air from the AAM comprises adjusting a heat dissipation effect of the coolant in the tank.

BRIEF DESCRIPTION OF THE DRAWINGS

For a more complete understanding of the present disclosure and its features/advantages, reference is now made to the following description, taken in conjunction with the accompanying drawings, which are not drawn to scale, and in which.

DETAILED DESCRIPTION

Figure 1:
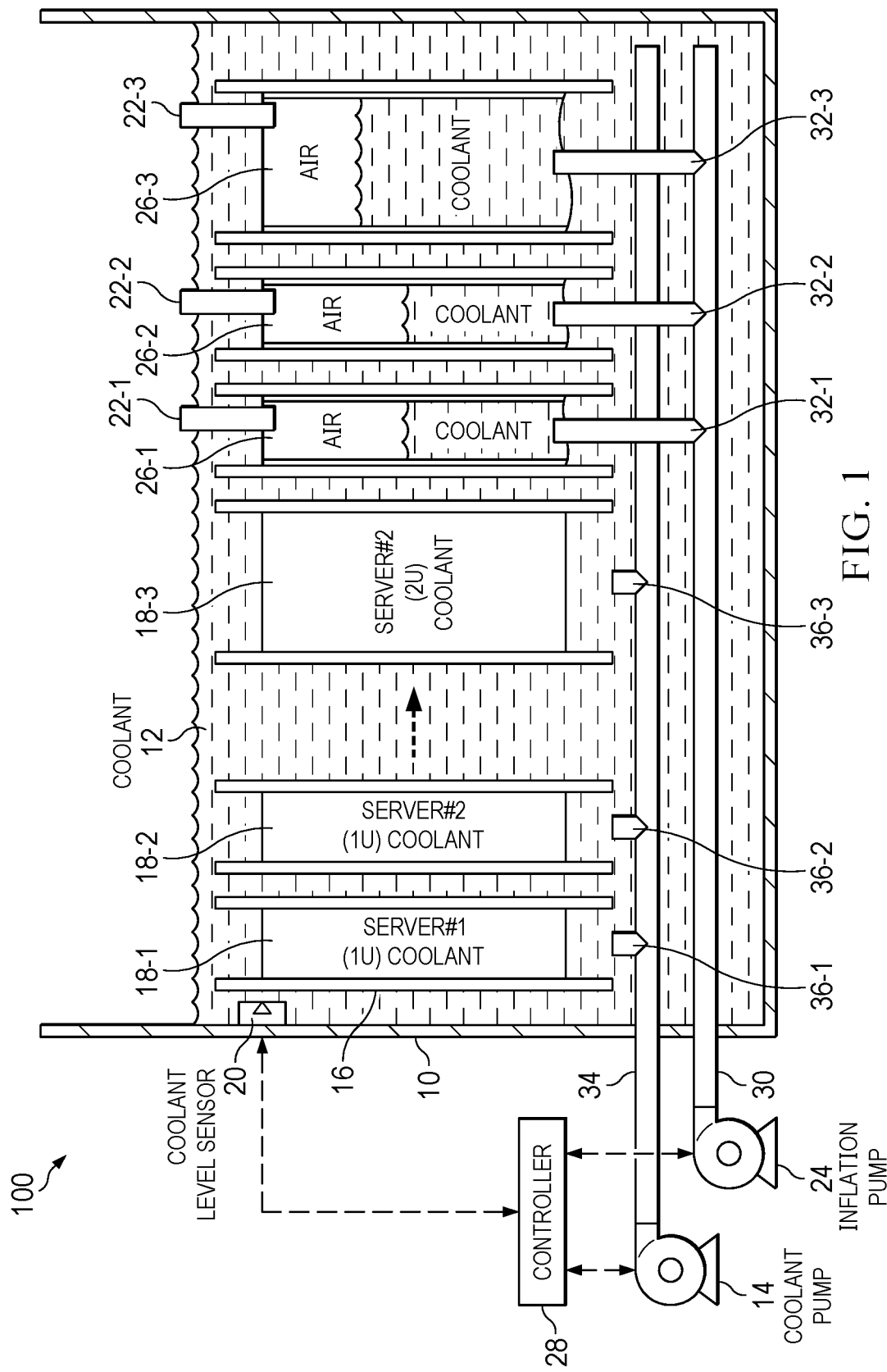
FIG. 1 depicts an embodiment of an immersion cooling system with a plurality of air-assist modules installed on rails, illustrating how air-assist modules may be substituted for servers to reduce the amount of coolant needed to immerse information handling systems.

In the following description, details are set forth by way of example to facilitate discussion of the disclosed subject matter. It should be apparent to a person of ordinary skill in the field, however, that the disclosed embodiments are examples and not exhaustive of all possible embodiments.

As used herein, a reference numeral refers to a class or type of entity, and any letter following such reference numeral refers to a specific instance of a particular entity of that class or type. Thus, for example, a hypothetical entity referenced by '12A' may refer to a particular instance of a particular class/type, and the reference '12' may refer to a collection of instances belonging to that particular class/type or any one instance of that class/type in general.

An information handling system (IHS) may include a hardware resource or an aggregate of hardware resources operable to compute, classify, process, transmit, receive, retrieve, originate, switch, store, display, manifest, detect, record, reproduce, handle, and/or utilize various forms of information, intelligence, or data for business, scientific, control, entertainment, or other purposes, according to one or more embodiments. For example, an IHS may be a personal computer, a desktop computer system, a laptop computer system, a server computer system, a mobile device, a tablet computing device, a personal digital assistant (PDA), a consumer electronic device, an electronic music player, an electronic camera, an electronic video player, a wireless access point, a network storage device, or another suitable device and may vary in size, shape, performance, functionality, and price. In one or more embodiments, a portable IHS may include or have a form factor of that of or similar to one or more of a laptop, a notebook, a telephone, a tablet, and a PDA, among others. For example, a portable IHS may be readily carried and/or transported by a user (e.g., a person). In one or more embodiments, components of an IHS may include one or more storage devices, one or more communications ports for communicating with external devices as well as various input and output (I/O) devices, such as a keyboard, a mouse, and a video display, among others. In one or more embodiments, IHS may include one or more buses operable to transmit communication between or among two or more hardware components. In one example, a bus of an IHS may include one or more of a memory bus, a peripheral bus, and a local bus, among others. In another example, a bus of an IHS may include one or more of a Micro Channel Architecture (MCA) bus, an Industry Standard Architecture (ISA) bus, an Enhanced ISA (EISA) bus, a Peripheral Component Interconnect (PCI) bus, HyperTransport (HT) bus, an inter-integrated circuit ($I^2C$) bus, a serial peripheral interface (SPI) bus, a low pin count (LPC) bus, an enhanced serial peripheral interface (eSPI) bus, a universal serial bus (USB), a system management bus (SMBus), and a Video Electronics Standards Association (VESA) local bus, among others.

In one or more embodiments, an IHS may include firmware that controls and/or communicates with one or more hard drives, network circuitry, one or more memory devices, one or more I/O devices, and/or one or more other peripheral devices. For example, firmware may include software embedded in an IHS component utilized to perform tasks. In one or more embodiments, firmware may be stored in non-volatile memory, such as storage that does not lose stored data upon loss of power. In one example, firmware associated with an IHS component may be stored in non-volatile memory that is accessible to one or more IHS components. In another example, firmware associated with an IHS component may be stored in non-volatile memory that may be dedicated to and includes part of that component. For instance, an embedded controller may include firmware that may be stored via non-volatile memory that may be dedicated to and includes part of the embedded controller.

An IHS may include a processor, a volatile memory medium, non-volatile memory media, an I/O subsystem, and a network interface. Volatile memory medium, non-volatile memory media, I/O subsystem, and network interface may be communicatively coupled to processor. In one or more embodiments, one or more of volatile memory medium, non-volatile memory media, I/O subsystem, and network interface may be communicatively coupled to processor via one or more buses, one or more switches, and/or one or more root complexes, among others. In one example, one or more of a volatile memory medium, non-volatile memory media, an I/O subsystem, and a network interface may be communicatively coupled to the processor via one or more PCI-Express (PCIe) root complexes. In another example, one or more of an I/O subsystem and a network interface may be communicatively coupled to processor via one or more PCIe switches.

In one or more embodiments, the term "memory medium" may mean a "storage device", a "memory", a "memory device", a "tangible computer readable storage medium", and/or a "computer-readable medium". For example, computer-readable media may include, without limitation, storage media such as a direct access storage device (e.g., a hard disk drive, a floppy disk, etc.), a sequential access storage device (e.g., a tape disk drive), a compact disk (CD), a CD-ROM, a digital versatile disc (DVD), a random access memory (RAM), a read-only memory (ROM), a one-time programmable (OTP) memory, an electrically erasable programmable read-only memory (EEPROM), and/or a flash memory, a solid state drive (SSD), or any combination of the foregoing, among others.

In one or more embodiments, one or more protocols may be utilized in transferring data to and/or from a memory medium. For example, the one or more protocols may include one or more of small computer system interface (SCSI), Serial Attached SCSI (SAS) or another transport that operates with the SCSI protocol, advanced technology attachment (ATA), serial ATA (SATA), a USB interface, an Institute of Electrical and Electronics Engineers (IEEE) 1394 interface, a Thunderbolt interface, an advanced technology attachment packet interface (ATAPI), serial storage architecture (SSA), integrated drive electronics (IDE), or any combination thereof, among others.

A volatile memory medium may include volatile storage such as, for example, RAM, DRAM (dynamic RAM), EDO RAM (extended data out RAM), SRAM (static RAM), etc. One or more of non-volatile memory media may include nonvolatile storage such as, for example, a read only memory (ROM), a programmable ROM (PROM), an erasable PROM (EPROM), an electrically erasable PROM, NVRAM (non-volatile RAM), ferroelectric RAM (FRAM), a magnetic medium (e.g., a hard drive, a floppy disk, a magnetic tape, etc.), optical storage (e.g., a CD, a DVD, a BLU-RAY disc, etc.), flash memory, a SSD, etc. In one or more embodiments, a memory medium can include one or more volatile storages and/or one or more nonvolatile storages.

In one or more embodiments, a network interface may be utilized in communicating with one or more networks and/or one or more other information handling systems. In one example, network interface may enable an IHS to communicate via a network utilizing a suitable transmission protocol and/or standard. In a second example, a network interface may be coupled to a wired network. In a third example, a network interface may be coupled to an optical network. In another example, a network interface may be coupled to a wireless network. In one instance, the wireless network may include a cellular telephone network. In a second instance, the wireless network may include a satellite telephone network. In another instance, the wireless network may include a wireless Ethernet network (e.g., a Wi-Fi network, an IEEE 802.11 network, etc.).

In one or more embodiments, a network interface may be communicatively coupled via a network to a network storage resource. For example, the network may be implemented as, or may be a part of, a storage area network (SAN), personal area network (PAN), local area network (LAN), a metropolitan area network (MAN), a wide area network (WAN), a wireless local area network (WLAN), a virtual private network (VPN), an intranet, an Internet or another appropriate architecture or system that facilitates the communication of signals, data and/or messages (generally referred to as data). For instance, the network may transmit data utilizing a desired storage and/or communication protocol, including one or more of Fibre Channel, Frame Relay, Asynchronous Transfer Mode (ATM), Internet protocol (IP), other packet-based protocol, Internet SCSI (iSCSI), or any combination thereof, among others.

In one or more embodiments, a processor may execute processor instructions in implementing at least a portion of one or more systems, at least a portion of one or more flowcharts, at least a portion of one or more methods, and/or at least a portion of one or more processes. In one example, a processor may execute processor instructions from one or more memory media in implementing at least a portion of one or more systems, at least a portion of one or more flowcharts, at least a portion of one or more methods, and/or at least a portion of one or more processes. In another example, a processor may execute processor instructions via a network interface in implementing at least a portion of one or more systems, at least a portion of one or more flowcharts, at least a portion of one or more methods, and/or at least a portion of one or more processes.

In one or more embodiments, a processor may include one or more of a system, a device, and an apparatus operable to interpret and/or execute program instructions and/or process data, among others, and may include one or more of a microprocessor, a microcontroller, a digital signal processor (DSP), an application specific integrated circuit (ASIC), and another digital or analog circuitry configured to interpret and/or execute program instructions and/or process data, among others. In one example, a processor may interpret and/or execute program instructions and/or process data stored locally (e.g., via memory media and/or another component of an IHS). In another example, a processor may interpret and/or execute program instructions and/or process data stored remotely (e.g., via a network storage resource).

In one or more embodiments, an I/O subsystem may represent a variety of communication interfaces, graphics interfaces, video interfaces, user input interfaces, and/or peripheral interfaces, among others. For example, an I/O subsystem may include one or more of a touch panel and a display adapter, among others. For instance, a touch panel may include circuitry that enables touch functionality in conjunction with a display that is driven by a display adapter.

A non-volatile memory medium may include an operating system (OS) and applications (APPs). In one or more embodiments, one or more of an OS and APPs may include processor instructions executable by a processor. In one example, a processor may execute processor instructions of one or more of OS and APPs via a non-volatile memory medium. In another example, one or more portions of the processor instructions of one or more of an OS and APPS may be transferred to a volatile memory medium and a processor may execute the one or more portions of the processor instructions.

Non-volatile memory medium may include information handling system firmware (IHSFW). In one or more embodiments, IHSFW may include processor instructions executable by a processor. For example, IHSFW may include one or more structures and/or one or more functionalities of and/or compliant with one or more of a basic input/output system (BIOS), an Extensible Firmware Interface (EFI), a Unified Extensible Firmware Interface (UEFI), and an Advanced Configuration and Power Interface (ACPI), among others. In one instance, a processor may execute processor instructions of IHSFW via non-volatile memory medium. In another instance, one or more portions of the processor instructions of IHSFW may be transferred to volatile memory medium, and processor may execute the one or more portions of the processor instructions of IHSFW via volatile memory medium.

With the development of cloud computing, high-density data centers require higher computing density and power density. Traditional air-cooled solutions can no longer meet the heat dissipation requirements. Immersion cooling systems (which may also be referred to as liquid cooling systems), generally involve positioning information handling systems in a tank filled with liquid coolant and using cooling liquids such as fluorocarbon or hydrocarbon oil for direct heat exchange and heat dissipation. Immersion cooling systems have become an effective solution for high-density heat dissipation. However, the high cost of the coolant has been a factor limiting the large-scale promotion of immersion cooling solutions.

Immersion cooling tanks frequently include vertically placed server enclosures, but the space in the tanks is not fully utilized, resulting in a low coolant utilization rate and increased costs. Embodiments disclosed herein comprise air-assist modules (AAMs) comprising pneumatic, adjustable modules to control the coolant level and distribution in a tank. An AAM may have a deflation valve and inflation pump to adjust its occupied space size for controlling the amount of coolant in the tank. Additionally, the ratio between gas and coolant in an AAM can be precisely controlled according to temperature changes in the tank to achieve targeted temperature control.

Referring to FIG. 1, embodiments of air-assisted liquid cooling system 100 generally comprise tank 10 containing a plurality of information handlings systems 18 (which may also be referred to as servers 18) mounted on rails 16. Servers 18 may have different sizes. For example, as depicted in FIG. 1, servers 18-1 and 18-2 are of a first size (e.g., 1U) and server 18-3 is of a second size (e.g., 2U).

Coolant pump 14 may pump coolant 12 into tank 10 such that servers 18 are immersed in coolant 12 and to ensure coolant 12 circulates throughout tank 10. Coolant level sensor 20 may be positioned to allow controller 38 to determine a level of coolant 12 in tank 10.

Coolant pump 14 may be coupled to coolant conduit 34 having multiple coolant inlet valves 36. In some embodiments, coolant inlet valves 36 may be positioned relative to servers 18 in tank 10. In some embodiments, coolant inlet valves 36 may be selectively controlled such that coolant 12 enters tank 10 through selected coolant inlet valves.

Air-Assist Modules (AAMS)—Overview

Still referring to FIG. 1, when there are unoccupied rails 16 in tank 10, one or more AAMs 26 may be installed on rails 16 and air may be used to inflate one or more AAMs 26. Each AAM 26 may comprise a non-permeable material formed into a hollow structure with one end closed and an opposite end open. AAMs 26 may be coupled to rails 16 when needed and removed to allow tank 10 to accommodate more servers 18. AAMs 26 may replace and occupy the excess volume associated with servers 18, reducing the total coolant demand while ensuring sufficient cooling for installed servers 18.

Inflation pump 24 may be coupled to air conduit 30 having one or more inlet valves 32. In some embodiments, inlet valves 32 may be positioned relative to AAMs 26 in tank 10. In some embodiments, air pumped into air conduit 30 exits only through selected inlet valves 32 positioned near an open end of an AAM 26. As air is pumped into AAMs 26, the air cannot escape, wherein coolant 12 in tank 10 may be displaced such that the total amount of coolant 12 in tank 10 may remain constant but the coolant level increases. By monitoring the volume inflated, a change in the tank coolant level may be detected or calculated and a final volume of liquid coolant 12 may be controlled.

If needed, air may be released from one or more AAMs 26 through deflation valves 22. In some embodiments, air may be released from selected AAMs 26 by selectively opening one or more deflation valves 22.

Embodiments may further comprise controller 38 storing a set of instructions and configured to execute the set of instructions to communicate with coolant level sensor 20 to ensure coolant 12 is maintained at a selected coolant level. In some embodiments, controller 38 may execute instructions to communicate with coolant level sensor 20 or other sensors (not shown) to ensure that a temperature of coolant 12 is maintained at a selected temperature or within a range of temperatures or is circulating throughout tank 10. In some embodiments, controller 38 may execute instructions to communicate with coolant level sensor 20 or other sensors (not shown) to ensure that a ratio between coolant 12 and air is maintained at a selected ratio or within a range of ratios. In some embodiments, a ratio between coolant 12 and air may be based on a temperature of coolant 12 or a temperature of one or more servers 18 in tank 10.

AAMs May be Inflated by Pumping Air Under an AAM

Figure 2:
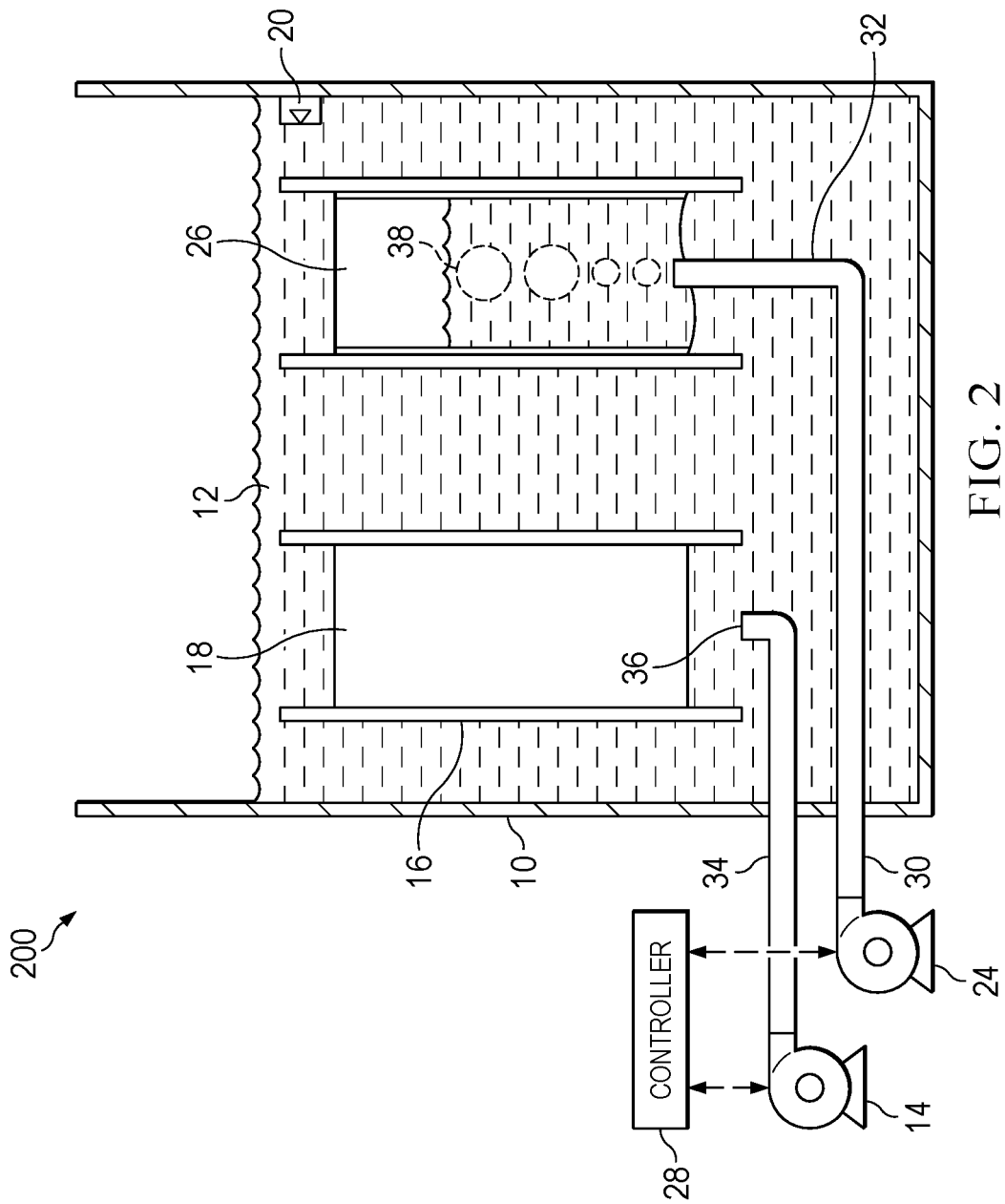
FIG. 2 depicts an embodiment of an immersion cooling system with an air-assist module, illustrating how air may be inflated into the air-assist module.

Referring to FIG. 2, in some embodiments, liquid cooling system 200 may be configured with rails 16 oriented to position servers 18 vertically, wherein air pumped into tank 10 forms bubbles 28 and rises to the surface of coolant 12. Bubbles 28 rising through coolant 12 may assist with circulation of coolant 12 in tank 10. As AAM 26 fills with air, coolant 12 is displaced. For the embodiment depicted in FIG. 2, AAM 26 does not comprise deflation valve 22, wherein AAM 26 may need to be removed to allow air to escape AAM 26. Embodiments may inflate AAM 26 with a selected amount of air to minimize the amount of coolant 12 needed to fill tank 10 or to ensure a ratio between coolant 12 and air is maintained below a selected ratio.

AAMs May be Selectively Inflated or Deflated

Figure 3:
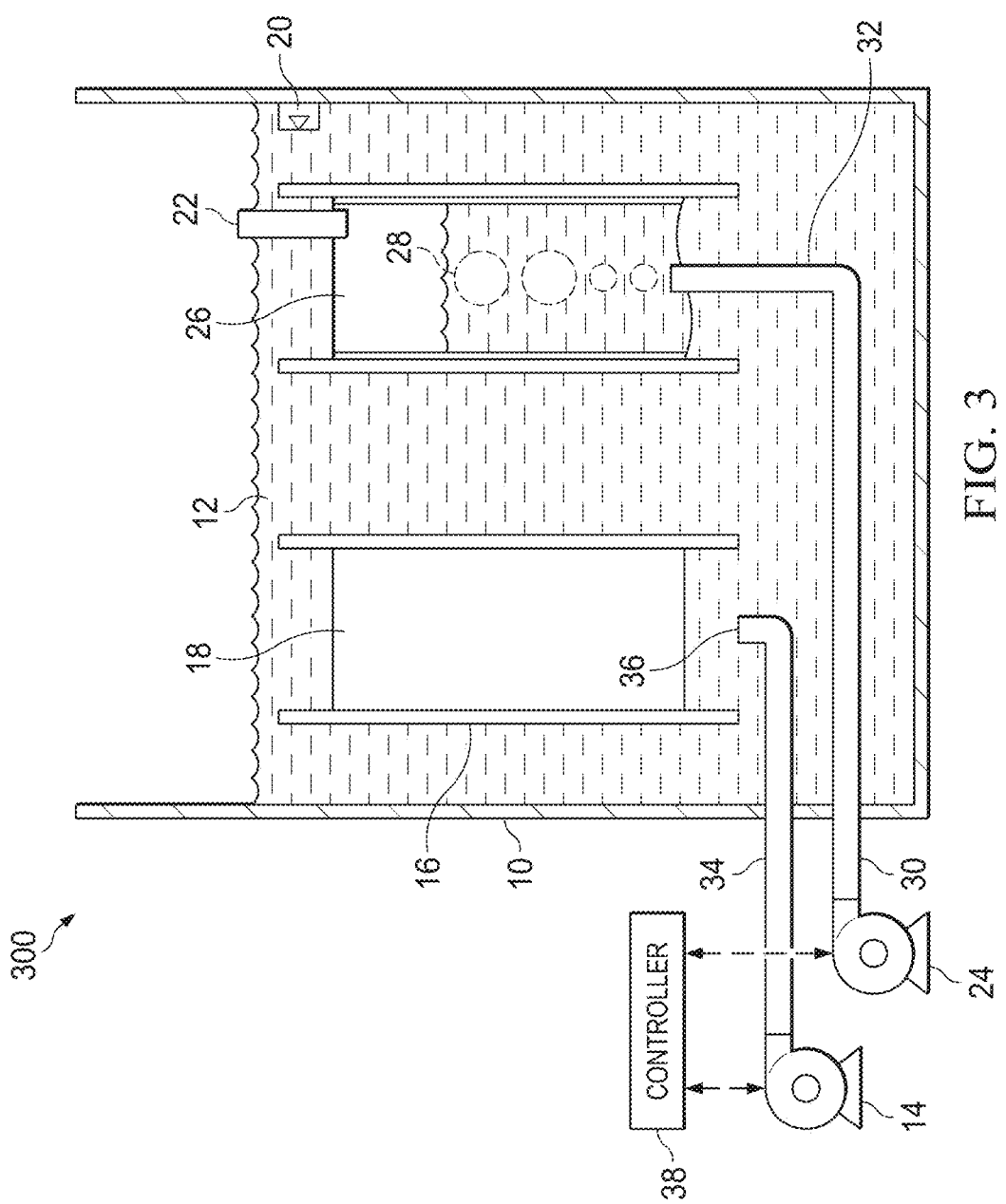
FIG. 3 depicts an embodiment of an immersion cooling system with an air-assist module, illustrating how air may be inflated into the air-assist module and deflated from the air-assist module.

Referring to FIG. 3, in some embodiments, liquid cooling system 300 may be configured with rails 16 oriented to position servers 18 vertically, wherein when one or more inlet valves 32 are opened, air pumped into tank 10 forms bubbles 28 and rises to the surface of coolant 12. Bubbles 28 rising through coolant 12 may assist with circulation of coolant 12 in tank 10. Inlet valves 32 and deflation valves 22 may be selectively controlled such that any AAM 26 can be inflated individually and two or more AAMs 26 may be filled collectively. As AAM 26 fills with air, coolant 12 is displaced. As depicted in FIG. 3, AAM 26 includes deflation valve 22, wherein deflation valve 22 may be opened to decrease the amount of air in tank 10. In some embodiments, controller 38 may communicate with coolant level sensor 20 to determine a level of coolant 12 in tank 10 and further determine a ratio between coolant 12 and air in tank 10. If the coolant level is low, controller 38 may execute instructions to increase the amount of coolant 12 in tank 10, increase the amount of air pumped into AAM 26, or some combination.

AAMs May be Inflated or Deflated to Adjust Temperature or Flow

Figure 4:
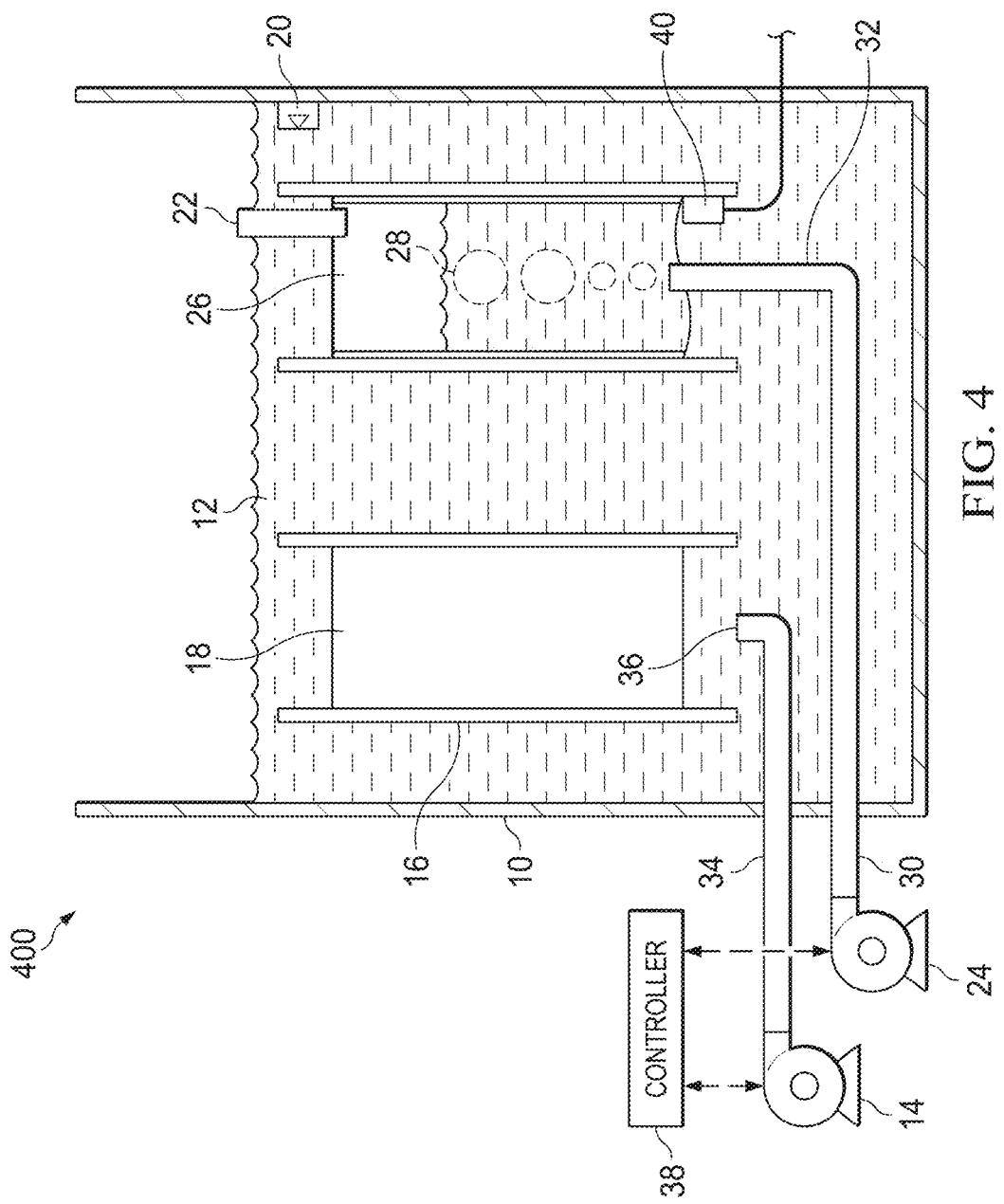
FIG. 4 depicts an embodiment of an immersion cooling system with an air-assist module, illustrating how air may be inflated into the air-assist module and deflated from the air-assist module based on temperature and/or flow.

Referring to FIG. 4, in some embodiments, liquid cooling system 400 may be configured with rails 16 oriented to position servers 18 vertically, wherein when one or more inlet valves 32 are opened, air pumped into tank 10 forms bubbles 28 and rises to the surface of coolant 12 and number of inlet valves 32 and how much each inlet valve is opened may affect flow of coolant 12 through tank 10. Bubbles 28 rising through coolant 12 may assist with circulation of coolant 12 in tank 10. As AAM 26 fills with air, coolant 12 is displaced. As depicted in FIG. 4, AAM 26 includes deflation valve 22 and sensor 40. Deflation valve 22 may be opened to decrease the amount of air in tank 10. Sensor 40 may be a temperature sensor, or a flow sensor positioned near the open end of AAM 26. In some embodiments, controller 38 may communicate with coolant level sensor 20 to determine a level of coolant 12 in tank 10 and a ratio between coolant 12 and air in tank 10. In some embodiments, controller 38 may communicate with sensor 40 to determine a temperature associated with AAM 26. If the coolant temperature is low, controller 38 may execute instructions to increase the amount of air in tank 10. If the coolant temperature is high, controller 38 may execute instructions to increase the amount of coolant 12 in tank 10. In some embodiments, controller 38 may communicate with sensor 40 to determine a flow associated with coolant 12 in AAM 26 and may execute instructions to operate (or not operate) coolant pump 12 and inflation pump 24 to adjust distribution of coolant 12 in tank 10.

Figure 5:
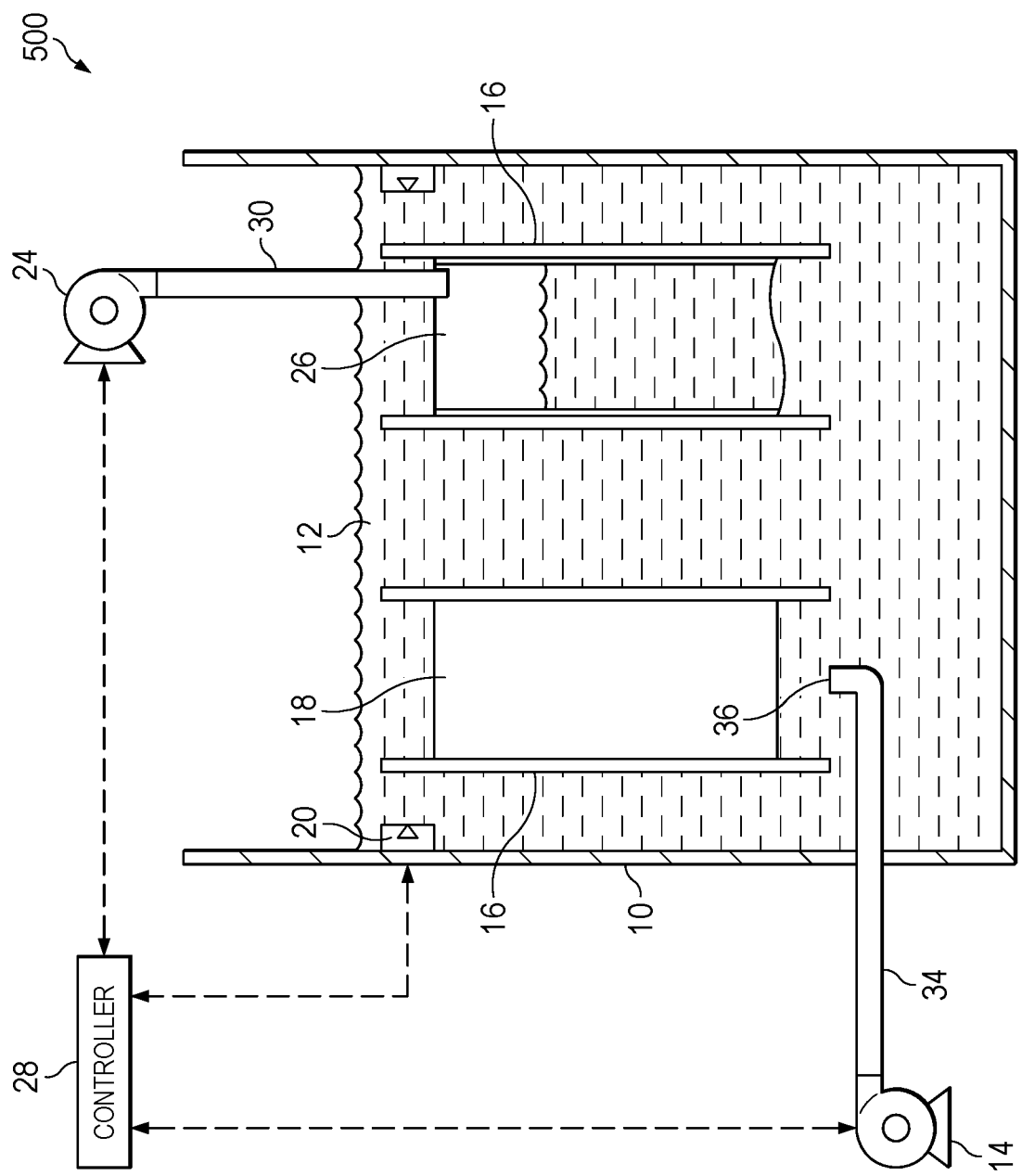
FIG. 5 depicts an embodiment of an immersion cooling system with an air-assist module, illustrating how air may be inflated into the air-assist module and deflated from the air-assist module using a single conduit.

Referring to FIG. 5, in some embodiments, liquid cooling system 500 may be configured with inflation pump 24 integrated with conduit 30. In some embodiments, one of inflation pump 24 or conduit 30 includes deflation valve 22 (not shown). As AAM 26 fills with air, coolant 12 is displaced. As depicted in FIG. 5, inflation pump 24 may be separate from, but coupled to, AAM 26.

Figure 6:
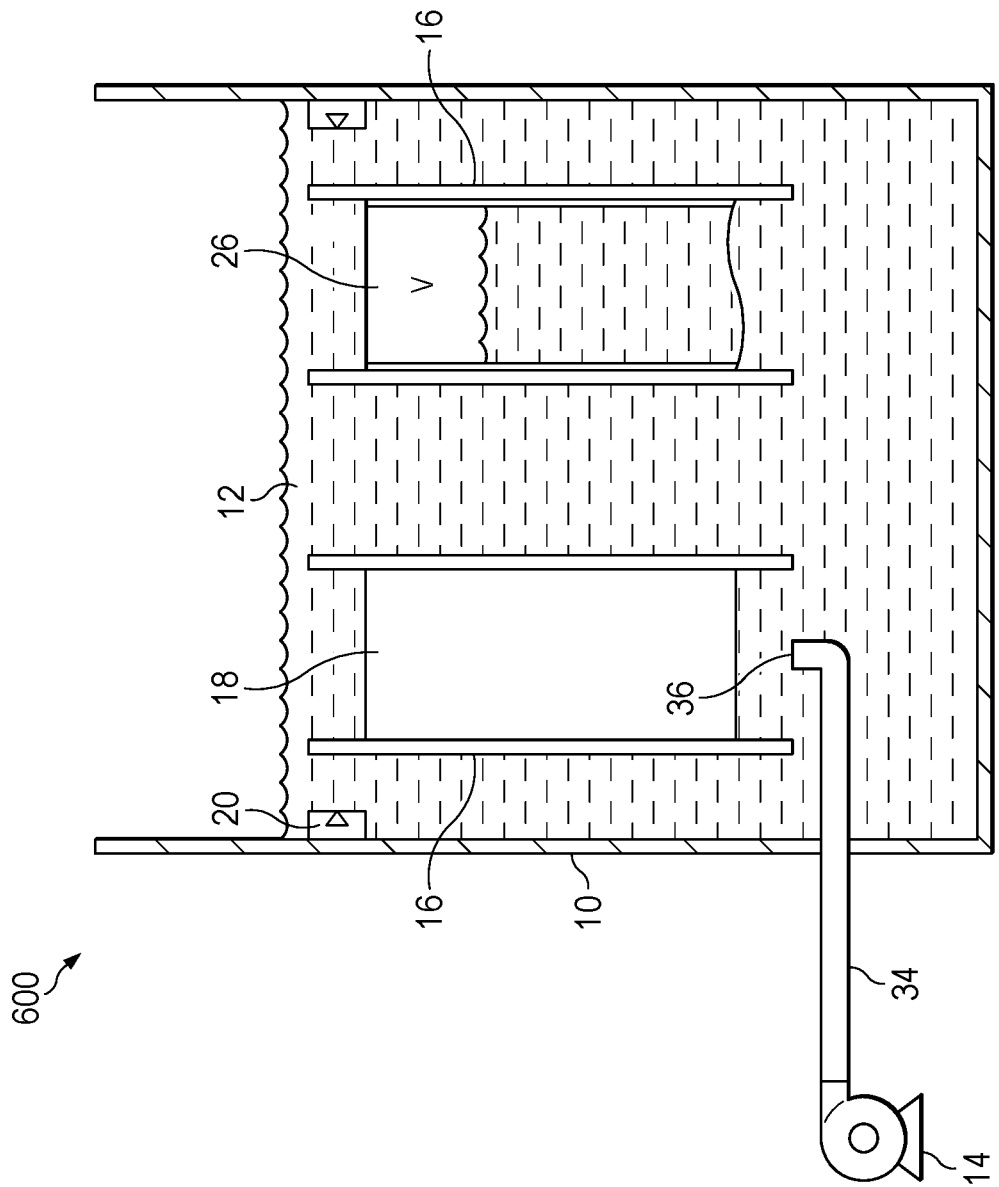
FIG. 6 depicts an embodiment of an immersion cooling system with an air-assist module, illustrating how an air-assist module may be pre-inflated with a controlled amount of air.

Referring to FIG. 6, in some embodiments, liquid cooling system 600 may be configured with one or more air-assist modules 26 that are pre-inflated to a known volume. AAMs 26 that are pre-inflated to a known volume may be advantageous when servicing tank 10, other AAMs 26 in tank 10 or servers 18 in tank 10. For example, if a single server 18 needs to be serviced, an AAM 26 may be pre-inflated with a volume of air to occupy the same volume as the server 18 being serviced. The server 18 may be removed and AAM 26 may be installed in tank 10 such that coolant does not need to be pumped into tank 10. Once server 18 is serviced, AAM 26 may be removed and server 18 may be installed, minimizing any disruption of cooling of other servers 18 in tank 10.

Using AAMs Based on Server Temperature

In some embodiments, AAMs 26 may assist with controlling server temperatures. For example, the heat dissipation in tank 10 may be adjusted by changing the ratio between coolant 12 and air in an AAM 26. The higher the ratio, the less coolant flows into AAM 26 for heat exchange, the lower the heat exchange efficiency and the lower the heat dissipation capacity of the AAM system. Conversely, a higher coolant-to-air ratio may be associated with a higher heat exchange efficiency and a higher heat dissipation capacity. In some embodiments, if a server temperature is too high or controller 38 determines the server temperature is increasing, controller 38 may increase a proportion of coolant 12 in tank 10, increase a flow of coolant 12 through tank 10, increase the heat exchange efficiency and/or accelerate heat dissipation to lower the server temperature. If a server temperature is relatively low, embodiments may increase the proportion of air in tank 10. Controller 38 may reduce the flow of coolant 12 in tank 10, reduce the heat exchange efficiency, or slow down the heat dissipation effect to prevent the server temperature from getting too low.

Embodiments described above may include variations. For example, in some embodiments, a gas may be used instead of air. As another example, referring to FIG. 5, in some embodiments, one or more of inflation pump 24 and deflation valve 22 may be integral with AAM 26, wherein installing AAM 26 may require only coupling AAM 26 to rails 16 and communicatively coupling AAM 26 to controller 38.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. An air-assist cooling system for a liquid cooling system comprising a tank, a plurality of rails for mounting a plurality of information handling systems, a coolant pump for introducing a liquid coolant to immerse the plurality of information handling systems in the liquid coolant and a coolant level sensor, the air-assist cooling system comprising:
   one or more air-assist modules (AAM) s mounted on a set of the plurality of rails;
   an inflation pump for introducing air into a particular AAM of the one or more AAMs;
   an air inlet valve positioned proximate to a first end of the particular AAM; and
   a controller configured to:
      communicate with the coolant level sensor to monitor a level of the liquid coolant in the tank;
      communicate with one or more of the coolant pump and the inflation pump to adjust an amount of the liquid coolant in the tank; and
      open the air inlet valve to inflate the particular AAM by introducing the air through the air inlet valve to form bubbles that rise towards a second end of the particular AAM opposite to the first end.

2. The air-assist cooling system of claim 1, further comprising a conduit coupling the inflation pump to the air inlet valve.

3. The air-assist cooling system of claim 1, wherein one or more of the inflation pump and/or a deflation valve are integral with the particular AAM, the deflation valve positioned proximate to the second end of the particular AAM.

4. The air-assist cooling system of claim 1, wherein the controller is further configured to adjust a ratio between the liquid coolant and the air in the tank.

5. The air-assist cooling system of claim 1, wherein the controller is further configured to adjust a flow of the liquid coolant in the tank.

6. The air-assist cooling system of claim 1, wherein the controller is further configured to adjust a heat exchange efficiency of the liquid coolant in the tank.

7. The air-assist cooling system of claim 1, wherein the controller is further configured to adjust a heat dissipation effect of the liquid coolant in the tank.

8. A cooling system for cooling a plurality of information handling systems, the cooling system comprising:
   a tank;
   a plurality of rails for mounting the plurality of information handling systems;
   a coolant pump for introducing a liquid coolant to immerse the plurality of information handling systems in the liquid coolant;
   a coolant level sensor for detecting a level of the liquid coolant in the tank;
   one or more air-assist modules (AAM) s mounted on a set of the plurality of rails;
   an inflation pump for introducing air into a particular AAM of the one or more AAMs;
   an air inlet valve positioned proximate to a first end of the particular AAM; and
   a controller configured to:
      communicate with the coolant level sensor to monitor a level of the liquid coolant in the tank;

communicate with one or more of the coolant pump and/or the inflation pump to adjust an amount of the liquid coolant in the tank; and/or open the air inlet valve to inflate the particular AAM by introducing the air through the air inlet valve to form bubbles that rise towards a second end of the particular AAM opposite the first end.

9. The cooling system of claim 8, further comprising a conduit coupling the inflation pump to the air inlet valve.

10. The cooling system of claim 8, wherein one or more of the inflation pump and/or a deflation valve are integral with the particular AAM, the deflation valve positioned proximate to the second end of the particular AAM.

11. The cooling system of claim 8, wherein the controller is further configured to adjust a ratio between the liquid coolant and the air in the tank.

12. The cooling system of claim 8, wherein the controller is further configured to adjust a flow of the liquid coolant in the tank.

13. The cooling system of claim 8, wherein the controller is further configured to adjust a heat exchange efficiency of the coolant in the tank.

14. The cooling system of claim 8, wherein the controller is further configured to adjust a heat dissipation effect of the liquid coolant in the tank.

15. A method of cooling information handling systems, the method comprising:

coupling an information handling system of the information handling systems to a server rail of a plurality of server rails in a tank;

coupling one or more air-assist modules (AAMs) to one or more rails of the plurality of rails;

operating a coolant pump to introduce a liquid coolant into the tank;

positioning an inflation pump relative to the one or more AAMs;

determining, by a controller communicatively coupled to a coolant level sensor, a level of the liquid coolant in the tank; and performing operations of:

operating the coolant pump to pump the liquid coolant into the tank, operating the inflation pump to displace at least a portion of the liquid coolant from a particular AAM of the one or more AAMs, operating an air inlet valve positioned proximate to a first end of the particular AAM to inflate the particular AAM by introducing air through the air inlet valve to form bubbles that rise towards a second end of the particular AAM to facilitate circulation of the liquid coolant in the tank, and/or operating a deflation valve positioned proximate to the second end of the particular AAM opposite to the first end to remove at least a portion of the air from the particular AAM.

16. The method of claim 15, wherein performing the operations of operating the coolant pump to pump the liquid coolant into the tank, operating the inflation pump to displace the at least the portion of the liquid coolant from the particular AAM, operating the air inlet valve to inflate the particular AAM, and/or operating the deflation valve to remove the at least the portion of the air from the particular AAM comprises adjusting a ratio between the liquid coolant and the air in the tank.

17. The method of claim 15, wherein performing the operations of operating the coolant pump to pump the liquid coolant into the tank, operating the inflation pump to displace the at least the portion of the liquid coolant from the particular AAM, operating the air inlet valve to inflate the particular AAM, and/or operating the deflation valve to remove the at least the portion of the air from the particular AAM comprises adjusting a heat exchange efficiency of the liquid coolant in the tank.

18. The method of claim 15, wherein performing the operations of operating the coolant pump to pump the liquid coolant into the tank, operating the inflation pump to displace the at least the portion of the liquid coolant from the particular AAM, operating the air inlet valve to inflate the particular AAM, and/or operating a deflation valve to remove the at least the portion of the air from the particular AAM comprises adjusting a heat dissipation effect of the liquid coolant in the tank.

\* \* \* \* \*